United States Patent
Isohata et al.

(10) Patent No.: US 10,320,396 B2
(45) Date of Patent: Jun. 11, 2019

(54) ELECTRONIC COMPONENT PACKAGE, OSCILLATOR, ELECTRONIC APPARATUS, AND BASE STATION

(71) Applicant: Seiko Epson Corporation, Tokyo (JP)

(72) Inventors: Kensaku Isohata, Minowa-machi (JP); Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 111 days.

(21) Appl. No.: 15/299,781

(22) Filed: Oct. 21, 2016

(65) Prior Publication Data

US 2017/0117902 A1 Apr. 27, 2017

(30) Foreign Application Priority Data

Oct. 23, 2015 (JP) .................. 2015-208666

(51) Int. Cl.
| | |
|---|---|
| *H03B 5/32* | (2006.01) |
| *H03H 9/02* | (2006.01) |
| *H03H 9/05* | (2006.01) |
| *H03H 9/10* | (2006.01) |
| *H03L 1/04* | (2006.01) |

(52) U.S. Cl.
CPC ............... *H03L 1/04* (2013.01); *H03B 5/32* (2013.01); *H03H 9/02102* (2013.01); *H03H 9/0552* (2013.01); *H03H 9/1021* (2013.01)

(58) Field of Classification Search
CPC ........ H03B 5/32; H03L 1/04; H03H 9/02102; H03H 9/0552; H03H 9/1021
USPC ............... 331/108 C, 158, 176; 310/344
See application file for complete search history.

(56) References Cited

U.S. PATENT DOCUMENTS

| | | | |
|---|---|---|---|
| 2009/0051447 A1 | 2/2009 | McCracken et al. | |
| 2012/0013021 A1* | 1/2012 | Kobayashi | ........ H01L 23/49827 257/774 |
| 2012/0235761 A1 | 9/2012 | Mitome et al. | |
| 2015/0180445 A1 | 6/2015 | Isohata | |
| 2016/0142010 A1 | 5/2016 | Isohata | |
| 2017/0149384 A1 | 5/2017 | Isohata | |
| 2018/0191300 A1 | 7/2018 | Isohata | |

FOREIGN PATENT DOCUMENTS

| | | |
|---|---|---|
| JP | 2012-085266 A | 4/2012 |
| JP | 2015-095790 A | 5/2015 |
| JP | 2015-122608 A | 7/2015 |

* cited by examiner

*Primary Examiner* — Arnold M Kinkead
(74) *Attorney, Agent, or Firm* — Oliff PLC

(57) ABSTRACT

A package includes a base member and a first projecting portion that projects from one surface of the base member. The first projecting portion contacts a first substrate on which an electronic component is mounted, and has an insulating property.

13 Claims, 12 Drawing Sheets

ELECTRONIC COMPONENT PACKAGE, OSCILLATOR, ELECTRONIC APPARATUS, AND BASE STATION

CROSS-REFERENCE TO RELATED APPLICATIONS

This application claims priority to Japanese Patent Application No. 2015-208666, filed Oct. 23, 2015, the entirety of which is hereby incorporated by reference.

BACKGROUND

1. Technical Field

The present invention relates to an electronic component package, an oscillator, an electronic apparatus, and a base station.

2. Related Art

In the related art, as an oscillator having highly accurate oscillation characteristics used for frequency control of a communication apparatus or the like for example, an oven controlled crystal oscillator (OCXO) including a resonator element that vibrates at a predetermined frequency and configured to control the resonator element at a predetermined temperature, for example, has been known. According to such an oven controlled crystal oscillator, it is possible to output a signal at a stable frequency without being affected by a change in outside temperature.

As one example of the oven controlled crystal oscillator, there is a piezoelectric oscillator disclosed in JP-A-2015-95790. The piezoelectric oscillator disclosed in JP-A-2015-95790 includes a package composed of a lower lid cover having a plate shape and an upper lid cover having a bottomed cylindrical shape, a circuit board provided within the package, and a resonator placed on the circuit board with a heating element therebetween and including a resonator element. In the piezoelectric oscillator disclosed in JP-A-2015-95790, the circuit board is connected to the lower lid cover through lead terminals.

In the piezoelectric oscillator having such a configuration, when the circuit board is connected to the lower lid cover through the lead terminals, the positioning of the circuit board with respect to the lower lid cover is not made. Therefore, the circuit board is disposed inclined to the lower lid cover for example, and as a result, a portion of the circuit board may come in contact with the lower lid cover. Therefore, in the related-art oscillator, the resonator element is likely to be affected by a change in temperature outside the package, and as a result, there is a problem in that frequency stability is degraded.

SUMMARY

An advantage of some aspects of the invention is to provide an electronic component package capable of reducing contact of a base member with a first substrate, and also to provide an oscillator, an electronic apparatus, and a base station each including the electronic component package.

The advantage can be achieved by the following aspects of the invention.

An electronic component package according to an aspect of the invention includes a base member, and a first projecting portion projecting from one surface of the base member, contacting a first substrate on which an electronic component is mounted, and having an insulating property.

According to the electronic component package, the first projecting portion contacts the first substrate, so that a distance (gap) between the first substrate and the base member can be defined to a predetermined interval, and thus, contact between the first substrate and the base member can be prevented or reduced. Therefore, since heat conduction between the base member and the first substrate can be reduced, it is possible to reduce the influence of a change in temperature outside the electronic component package on the electronic component. As a result, the temperature control of the electronic component can be performed with high accuracy.

In the electronic component package according to the aspect of the invention, it is preferable that the electronic component package further includes a second projecting portion projecting from the other surface of the base member, contacting a second substrate above which the base member is mounted, and having an insulating property.

With this configuration, the second projecting portion contacts the second substrate, so that a distance (gap) between the second substrate and the base member can be defined to a predetermined interval, and thus, contact between the second substrate and the base member can be prevented or reduced. Therefore, heat conduction between the base member and the second substrate can be reduced.

In the electronic component package according to the aspect of the invention, it is preferable that a through-hole is provided in the base member, and that the first projecting portion and the second projecting portion are configured integrally with a member penetrating the through-hole.

With this configuration, the first projecting portion and the second projecting portion can be collectively formed easily.

In the electronic component package according to the aspect of the invention, it is preferable that the first projecting portion and the second projecting portion overlap in a plan view of the base member.

With this configuration, the design of the base member can be facilitated.

In the electronic component package according to the aspect of the invention, it is preferable that the first projecting portion and the second projecting portion are provided at different positions in a plan view of the base member.

With this configuration, a heat transfer path between the first projecting portion and the second projecting portion can be lengthened. Therefore, the transfer of heat between the inside and the outside of the electronic component package through the first projecting portion and the second projecting portion can be reduced.

In the electronic component package according to the aspect of the invention, it is preferable that when the base member is viewed in a plan view, the area of the first projecting portion is smaller than the area of the second projecting portion.

With this configuration, the contact area of the first projecting portion with the first substrate can be relatively reduced. Therefore, the transfer of heat from the base member to the first substrate through the first projecting portion can be further reduced.

In the electronic component package according to the aspect of the invention, it is preferable that a projecting height of the first projecting portion is lower than a projecting height of the second projecting portion.

With this configuration, a distance between the first substrate and the base member can be relatively shortened. Therefore, the low profile of the electronic component package can be achieved.

In the electronic component package according to the aspect of the invention, it is preferable that the first substrate includes a recess or through-hole provided in a portion contacting the first projecting portion.

With this configuration, the distance between the first substrate and the base member can be reduced, and thus, the low profile of the package can be achieved.

In the electronic component package according to the aspect of the invention, it is preferable that at least one of the first projecting portion and the second projecting portion includes a surface having a spherical shape.

With this configuration, the contact area of the first projecting portion with the first substrate, or the contact area of the second projecting portion with the second substrate can be relatively reduced. Therefore, heat transfer between the first substrate and the base member through the first projecting portion, or heat transfer between the second substrate and the base member through the second projecting portion can be further reduced.

In the electronic component package according to the aspect of the invention, it is preferable that the electronic component package further includes a pin penetrating the first substrate, electrically connected with the first substrate, and having conductivity, and that the first projecting portion and the pin support the first substrate with respect to the base member.

By electrically connecting the pin with, for example, the second substrate, the first substrate and the second substrate can be electrically connected.

Here, since the pin is configured to penetrate the first substrate, it is difficult to position with high accuracy the first substrate with respect to the base member only by the pin. In contrast thereto, the electronic component package according to the aspect of the invention includes the first projecting portion contacting the first substrate. Therefore, the first substrate can be positioned with high accuracy with respect to the base member, and thus, contact of the first substrate with the base member can be reduced.

In the electronic component package according to the aspect of the invention, it is preferable that the first projecting portion contains glass.

With this configuration, heat transfer between the first substrate and the base member through the first projecting portion can be further reduced. Moreover, since the first projecting portion contains glass, the first projecting portion can be made relatively less deformable. Moreover, the first projecting portion having an insulating property can be easily formed.

In the electronic component package according to the aspect of the invention, it is preferable that the electronic component package includes at least three or more first projecting portions.

With this configuration, the posture of the first substrate with respect to the base member can be regulated with higher accuracy while reducing the contact area of the first projecting portion with the first substrate. Therefore, variations in the distance between the first substrate and the base member can be reduced while reducing heat conduction between the first substrate and the base member.

An oscillator according to another aspect of the invention includes: the electronic component package according to the aspect of the invention; the first substrate; a resonator provided on the first substrate and including a resonator element; and an oscillation circuit electrically connected to the resonator.

According to the oscillator, the electronic component package in which contact of the first substrate with the base member is reduced is included. Therefore, temperature fluctuation due to the contact between the first substrate and the base member is reduced, and thus it is possible to provide a highly stable oscillator with less change in frequency.

In the oscillator according to the aspect of the invention, it is preferable that the oscillator further includes a temperature control element controlling the temperature of the resonator element.

With this configuration, the resonator element can be maintained at a desired temperature. In particular, when a reduced-pressure state is produced within the electronic component package, temperature fluctuation of the resonator element can be reduced to realize an oven controlled oscillator having excellent frequency stability.

An electronic apparatus according to still another aspect of the invention includes the electronic component package according to the aspect of the invention.

According to the electronic apparatus, high reliability can be provided.

A base station according to further another aspect of the invention includes the electronic component package according to the aspect of the invention.

According to the base station, high reliability can be provided.

BRIEF DESCRIPTION OF THE DRAWINGS

The various aspects of the invention will be described with reference to the accompanying drawings, wherein like numbers reference like elements.

DESCRIPTION OF EXEMPLARY EMBODIMENTS

Hereinafter, an electronic component package, an oscillator, an electronic apparatus, and a base station according to the invention will be described in detail based on preferred embodiments shown in the accompanying drawings.

1. Oscillator

First Embodiment

Figure 1:
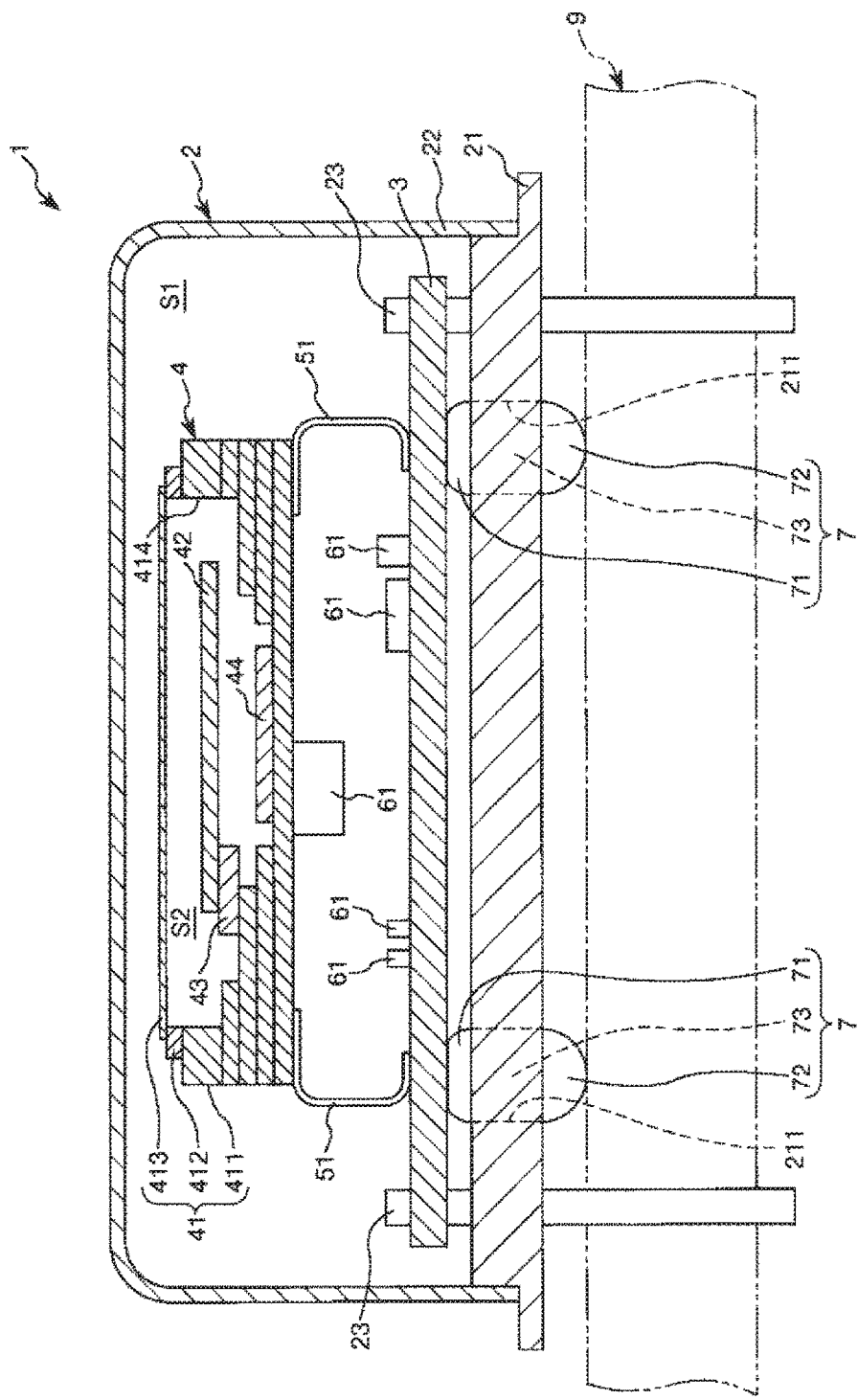
FIG. 1 is a cross-sectional view showing an oscillator including an electronic component package according to a first embodiment of the invention.
Figure 2:
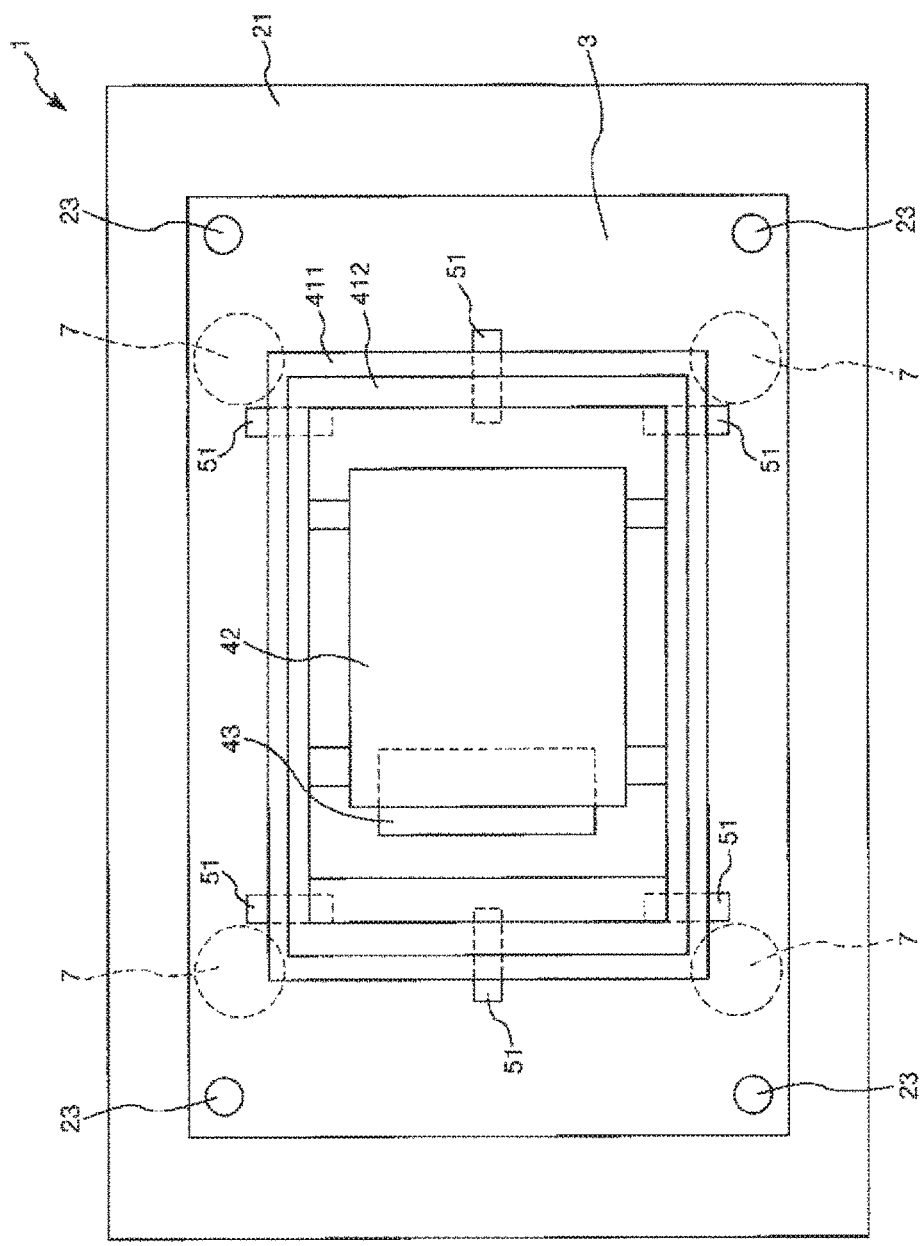
FIG. 2 is a plan view of the oscillator shown in FIG. 1.
Figure 3:
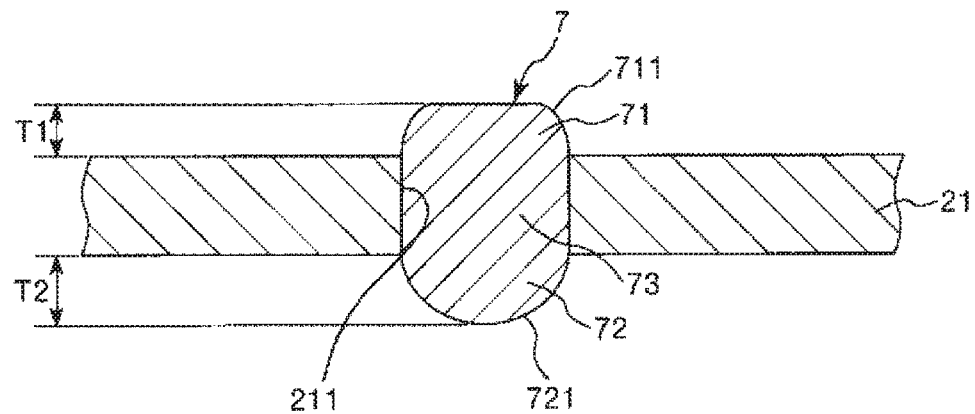
FIG. 3 is a cross-sectional view showing a regulating member shown in FIG. 1.
Figure 4:
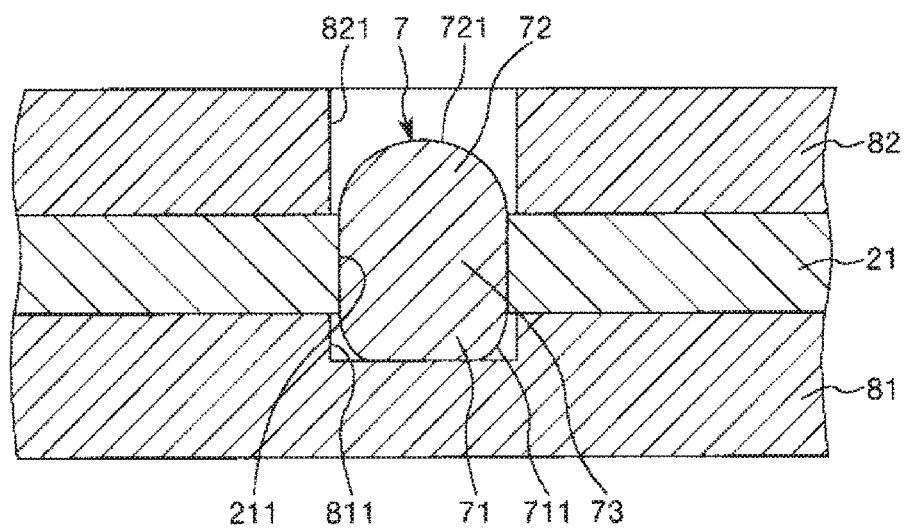
FIG. 4 is a cross-sectional view showing a method for manufacturing the regulating member shown in FIG. 3.

FIG. 1 is a cross-sectional view showing an oscillator including an electronic component package according to a first embodiment of the invention. FIG. 2 is a plan view of the oscillator shown in FIG. 1. FIG. 3 is a cross-sectional view showing a regulating member shown in FIG. 1. FIG. 4 is a cross-sectional view showing a method for manufacturing the regulating member shown in FIG. 3. In the following, for convenience of description, the upper side in FIG. 1 is referred to as "up", and the lower side is referred to as "down".

The oscillator 1 shown in FIG. 1 includes a package 2 (electronic component package) including a base member 21 and a lid member 22, a first substrate 3 (circuit board) provided in the package 2, a resonator 4 provided above the first substrate 3 and including a resonator element 42, and a plurality of circuit components 61. As shown in FIG. 1, the oscillator 1 is mounted for use on, for example, a second substrate 9 or the like as a mounting board.

The oscillator 1 is an oven controlled crystal oscillator (OCXO), and configured to control the temperature of the resonator element 42 at a predetermined temperature. For this reason, the influence of a change in outside temperature is small, so that it is possible to obtain an output signal with high frequency stability.

Hereinafter, the configuration of each part of the oscillator 1 will be successively described.

Package

The package 2 has a function of accommodating the first substrate 3, the resonator 4, and the plurality of circuit components 61.

As shown in FIG. 1, the package 2 includes the base member 21 having a plate shape and the lid member 22 having a bottomed cylindrical shape. Moreover, the package 2 includes a plurality of (four in the embodiment) pins 23 provided in the base member 21 and a plurality of (four in the embodiment) regulating members 7.

The lid member 22 is bonded to the base member 21 such that the opening of the lid member 22 is closed by the base member 21. With this configuration, a space S1 in which the first substrate 3, the resonator 4, and the plurality of circuit components 61 are accommodated is formed.

The base member 21 and the lid member 22 are airtightly bonded together. The space S1 may be in a reduced-pressure state, or an inert gas such as nitrogen, argon, or helium may be filled therein.

The method for bonding the base member 21 and the lid member 22 together is not particularly limited as long as the airtightness of the space S1 can be ensured by the method. For example, examples of the bonding method include brazing, seam welding, and energy beam welding.

The constituent materials of the base member 21 and the lid member 22 are not particularly limited, and for example, a resin material, a ceramic material, a glass material, a metal material, or the like can be used.

Although not illustrated, the base member 21 may be provided with wires, electrodes, terminals, and the like that are electrically connected with the pins 23.

Moreover, as described above, the package 2 includes the plurality of (four in the embodiment) pins 23 (lead terminals) and the plurality of (four in the embodiment) regulating members 7.

Each of the plurality of pins 23 has a long rod shape, penetrates the base member 21 in the thickness direction thereof, and is fixed to the base member 21. Moreover, each of the plurality of pins 23 penetrates the second substrate 9 in the thickness direction thereof, and is fixed to the second substrate 9.

As shown in FIG. 2, the plurality of pins 23 are provided in the peripheral portion of the base member 21. In the embodiment, the base member 21 has a quadrilateral shape in a plan view as viewed in the thickness direction thereof (a plan view of the base member 21), and the plurality of pins 23 are provided at the corner portions of the base member 21.

The plurality of regulating members 7 will be described in detail later.

First Substrate

As shown in FIG. 1, the first substrate 3 (circuit board) is provided above the base member 21. On the surface of the first substrate 3, wires, electrodes, and the like (not shown) are formed. The wires, electrodes, and the like are electrically connected with the plurality of pins 23.

As shown in FIG. 2, the first substrate 3 has a quadrilateral shape in a plan view, and the plurality of pins 23 described above penetrate the corner portions of the first substrate 3. Further, the first substrate 3 and the second substrate 9 are electrically connected by means of the plurality of pins 23.

The constituent material of the first substrate 3 is not particularly limited, and for example, a resin material, a ceramic material, a metal material, or the like can be used. As the constituent material of the wires, electrodes, and the like (not shown) formed on the surface of the first substrate 3, for example, metal materials such as tungsten (W), molybdenum (Mo), nickel (Ni), and gold (Au) can be used alone or in combination of two or more.

Resonator

As shown in FIG. 1, the resonator 4 is supported to the first substrate 3 through a plurality of lead frames 51.

The resonator 4 includes a package 41, the resonator element 42 accommodated in the package 41, a temperature control element 43, and an integrated circuit 44.

The package 41 includes a base body 411 having a box shape and including a recess 414 opened in the upper surface, and a lid body 413 having a plate shape and bonded to the base body 411 through a seal ring 412 so as to close the opening of the recess 414. The recess 414 is closed by the lid body 413, so that a space S2 in which the resonator element 42, the temperature control element 43, and the integrated circuit 44 are accommodated is formed. The space S2 is in a reduced-pressure state.

Although not illustrated, wires, electrodes, and the like that are electrically connected with the resonator element 42, the temperature control element 43, and the integrated circuit 44 are formed on the base body 411.

The constituent materials of the base body 411 and the lid body 413 are not particularly limited, and a resin material, a ceramic material, a glass material, or the like can be used.

The integrated circuit 44 is provided on the bottom surface of the recess 414. The integrated circuit 44 includes, for example, an oscillation circuit that oscillates the resonator element 42 and a temperature control circuit that controls the temperature control element 43.

The integrated circuit 44 is electrically connected to the wires, electrodes, and the like (not shown) formed on the base body 411 described above.

In the embodiment, the integrated circuit 44 is provided in the interior of the package 41 as described above; however, the integrated circuit 44 may be provided outside the package 41.

The temperature control element 43 is provided on the base body 411. The temperature control element 43 has a function of controlling the temperature of the resonator element 42 at a predetermined temperature.

The temperature control element 43 is, for example, a heat generating IC, and includes a heat generating circuit and a temperature sensor. The heat generating circuit is a circuit that generates heat in response to a current flowing into a resistor. The heat generating circuit may be an element that generates heat in response to power input thereto, such as a power transistor. The temperature sensor is provided in proximity to the resonator element 42, and outputs a signal according to temperature. The temperature sensor is composed of, for example, a diode or a thermistor.

In the temperature control element 43, the heat generating circuit is controlled based on the signal from the temperature sensor by the temperature control circuit (not shown) included in the integrated circuit 44, so that the resonator element 42 is controlled at a predetermined temperature.

The temperature control element 43 is electrically connected to the wires, electrodes, and the like (not shown) formed on the base body 411 described above.

The arrangement or the like of the temperature control element 43 is not limited to that shown in the drawing as long as the temperature of the resonator element 42 can be controlled at a predetermined temperature.

The resonator element 42 is provided on the temperature control element 43.

In the embodiment, an SC-cut quartz crystal resonator element is used as the resonator element 42. With this configuration, the frequency stability of the oscillator 1 can be made particularly excellent. The resonator element 42 is not limited to an SC-cut quartz crystal resonator element, and for example, any quartz crystal resonator element such as an AT-cut quartz crystal resonator element or a BT-cut quartz crystal resonator element may be used.

Although not illustrated, the resonator element 42 is provided with excitation electrodes. The excitation electrodes are electrically connected to the wires, electrodes, and the like (not shown) formed on the base body 411 described above.

Circuit Component

As shown in FIG. 1, the plurality of circuit components 61 are provided on the lower surface of the resonator 4 and the upper surface of the first substrate 3. The plurality of circuit components 61 are circuit constituting members that constitute the oscillation circuit, the temperature control circuit, and the like together with the integrated circuit 44 described above. Examples of the circuit component 61 include, for example, an IC, a resistance element, a capacitor element, and an inductor element.

The configuration of the oscillator 1 has been briefly described above. Next, the plurality of regulating members 7 included in the package 2 described above will be described in detail.

Regulating Member

As described above, the package 2 includes the plurality of regulating members 7 provided in the base member 21.

As shown in FIG. 1, each of the plurality of regulating members 7 penetrates the base member 21 in the thickness direction thereof, and is fixed to the base member 21. Moreover, each of the plurality of regulating members 7 is provided so as to contact the first substrate 3 and the second substrate 9.

As shown in FIG. 2, the plurality of regulating members 7 are provided in the peripheral edge portion (corner portions in the embodiment) of the base member 21, and provided spaced apart from each other.

As shown in FIG. 3, the regulating member 7 includes a first projecting portion 71 that projects from the upper surface (one surface) of the base member 21, a second projecting portion 72 that projects from the lower surface (the other surface) of the base member 21, and a connection member 73 that connects the first projecting portion 71 and the second projecting portion 72 together and is filled in a through-hole 211 formed to penetrate the base member 21 in the thickness direction thereof.

The first projecting portion 71 and the second projecting portion 72, and the connection member 73 connecting the first and second projecting portions are integrally configured. Moreover, in the embodiment, the first projecting portion 71, the second projecting portion 72, and the connection member 73 are configured of a material mainly containing glass, and have an insulating property.

The first projecting portion 71 has a shape such that the upper end portion of a hemisphere is cut off, an outer surface 711 of the first projecting portion 71 has a shape along a spherical surface (spherical shape) except for the upper end, and the upper end is a flat surface. The first substrate 3 contacts the flat surface in the outer surface 711. Since the portion contacting the first substrate 3 is a flat surface, the first substrate 3 can be stably supported.

On the other hand, the second projecting portion 72 has a hemisphere-like shape, and an outer surface 721 of the second projecting portion 72 has a shape along a spherical surface (spherical shape). The second substrate 9 contacts the lower end of the outer surface 721.

The first projecting portion 71 and the second projecting portion 72 overlap in the plan view of the base member 21.

According to the regulating member 7 including the first projecting portion 71 and the second projecting portion 72, the base member 21 is supported to the second substrate 9, the first substrate 3 is supported to the base member 21, and also, a distance between the base member 21 and the second substrate 9 and a distance between the first substrate 3 and the base member 21 can be regulated.

Specifically, since the package 2 includes the first projecting portion 71 projecting from the upper surface of the base member 21, the first projecting portion 71 contatcts the first substrate 3 when the first substrate 3 is mounted on the base member 21. In this manner, the first projecting portion 71 contacts the first substrate 3, so that the distance (gap) between the first substrate 3 and the base member 21 can be defined to a predetermined interval. Therefore, contact between the first substrate 3 and the base member 21 can be prevented or reduced, and thus, heat conduction between the base member 21 and the first substrate 3 can be reduced. With this configuration, since it is possible to reduce the influence of a change in temperature outside the package 2 on the resonator 4 connected to the first substrate 3 through the lead frames 51, temperature control of the resonator element 42 included in the resonator 4 can be performed with high accuracy. As a result, the oscillator 1 can output a highly stable signal with less change in frequency.

Here, in the package 2 as described above, the first substrate 3 is supported to the base member 21 not only by the regulating members 7 but also by the plurality of pins 23.

When the plurality of pins 23 are fixed to the base member 21 and the first substrate 3, the plurality of pins 23 are fixed to the base member 21 for example, and thereafter, the pins 23 are inserted through the first substrate 3. In doing so, since the width of the pin 23 is constant, the position of the first substrate 3 cannot be regulated. If it is intended to configure the pin 23 so as to be able to regulate the position of the first substrate 3, processing is difficult.

In contrast thereto, the package 2 of the embodiment includes the first projecting portion 71 provided so as to contacts the first substrate 3, the first substrate 3 can be positioned with high accuracy with respect to the base member 21. Moreover, the formation of the regulating member 7 is relatively easy as will be described later.

Moreover, the package 2 of the embodiment includes, in addition to the first projecting portion 71, the second projecting portion 72 projecting from the lower surface of the base member 21. Similarly to the first projecting portion 71, also the second projecting portion 72 is provided so as to contact the second substrate 9, unlike the pin 23 penetrating the second substrate 9. Therefore, since the second projecting portion 72 contacts the second substrate 9, the distance (gap) between the second substrate 9 and the base member 21 can be defined to a predetermined interval. For this reason, contact between the second substrate 9 and the base member 21 can be prevented or reduced, and thus, heat conduction between the base member 21 and the second substrate 9 can be reduced.

Moreover, as described above, the package 2 includes four first projecting portions 71, and the four first projecting portions 71 are provided spaced apart from each other. Therefore, the posture of the first substrate 3 with respect to the base member 21 can be regulated with higher accuracy. Thus, variations in the distance between the first substrate 3 and the base member 21 can be further reduced.

Similarly, the package 2 includes four second projecting portions 72, and the four second projecting portions 72 are provided spaced apart from each other. Therefore, the posture of the base member 21 with respect to the second substrate 9 can be regulated with higher accuracy while further reducing the contact area of the second projecting portion 72 with the second substrate 9. For this reason, heat transfer between the second substrate 9 and the base member 21 through the second projecting portion 72 can be further reduced, and also variations in the distance between the second substrate 9 and the base member 21 can be further reduced.

In the embodiment, the package 2 includes four first projecting portions 71; however, advantageous effects equivalent to the advantageous effects described above can be provided as long as the package 2 includes at least three first projecting portions 71. The same applies to the second projecting portion 72.

Further, as described above, the outer surface 721 of the second projecting portion 72 has a spherical shape (curved shape). With this configuration, the contact area of the second projecting portion 72 with the second substrate 9 can be further reduced. Therefore, the heat transfer between the second substrate 9 and the base member 21 through the second projecting portion 72 can be further reduced.

In the embodiment, the entire outer surface 721 of the second projecting portion 72 is of a spherical shape; however, advantageous effects equivalent to the advantageous effects described above can be provided as long as at least a portion of the outer surface 721 contacting the second substrate 9 has a spherical shape even when the entire outer surface 721 is not of a spherical shape.

As shown in FIG. 3, a projecting height T1 of the first projecting portion 71 is smaller than a projecting height T2 of the second projecting portion 72. Therefore, the distance between the first substrate 3 contacting the first projecting portion 71 and the base member is shorter than the distance between the second substrate 9 contacting the second projecting portion 72 and the base member 21. With this configuration, the distance between the first substrate 3 and the base member 21 can be relatively shortened, and thus, the low profile of the package 2 can be achieved.

In the regulating member 7 as described above, the first projecting portion 71 and the second projecting portion 72 are configured integrally together with the connection member 73. For this reason, the first projecting portion 71 and the second projecting portion 72 can be collectively formed easily. Hence, the package 2 including the first projecting portion 71 and the second projecting portion 72 can be manufactured more easily.

Moreover, the first projecting portion 71, the second projecting portion 72, and the connection member 73 overlap in a plan view. For this reason, the design of the base member 21 can be facilitated.

Moreover, as described above, the regulating member 7 is configured of the material mainly containing glass, and has an insulating property. Since the regulating member 7 has an insulating property, a short circuit among the first substrate 3, the base member 21, and the second substrate 9 through the regulating member 7 can be prevented or reduced. Moreover, since the regulating member 7 is configured of the material mainly containing glass, heat transfer among the first substrate 3, the base member 21, and the second substrate 9 can be further reduced. Moreover, by the use of the material mainly containing glass, the regulating member 7 whose shape is less deformable can be formed.

In the embodiment, the regulating member 7 is configured of the material mainly containing glass; however, the regulating member 7 is not particularly limited as long as at least the surface has an insulating property, and for example, the regulating member 7 may be configured of a material mainly containing a resin material.

The regulating member 7 can be formed using, for example, two jigs 81 and 82 shown in FIG. 4. One jig 81 of the two jigs 81 and 82 includes a recess 811 opened in the upper surface. The other jig 82 includes a through-hole 821 penetrating the upper and lower surfaces.

First, the jigs 81 and 82 are disposed with respect to the base member 21 so as to interpose the base member 21 therebetween such that the recess 811 of the jig 81 and the through-hole 821 of the jig 82 overlap the through-hole 211 of the base member 21 in a plan view. Then, the material mainly containing glass is melted and put into a hole composed of the through-hole 821, the through-hole 211, and the recess 811, and thereafter, the material is hardened. With this configuration, the regulating member 7 including the first projecting portion 71, the connection member 73, and the second projecting portion 72 integrated together can be formed.

When the regulating member 7 is formed as described above, the material mainly containing glass is hardened on the through-hole 821 side in a state of being raised in a spherical shape due to surface tension. Therefore, according to the method described above, the second projecting portion 72 including a spherical shaped surface can be easily formed.

On the other hand, on the recess 811 side, the material mainly containing glass is hardened in a state of following the flat bottom surface of the recess 811. Thus, as shown in FIG. 3, the first projecting portion 71 having a spherical shape except for the upper end and having a flat surface at the upper end is formed.

In particular, by the use of the material mainly containing glass as the material constituting the regulating member 7, the first projecting portion 71 and the second projecting portion 72 including the spherical shaped surface can be easily formed by the method described above.

Second Embodiment

Next, a second embodiment of the invention will be described.

Figure 5:
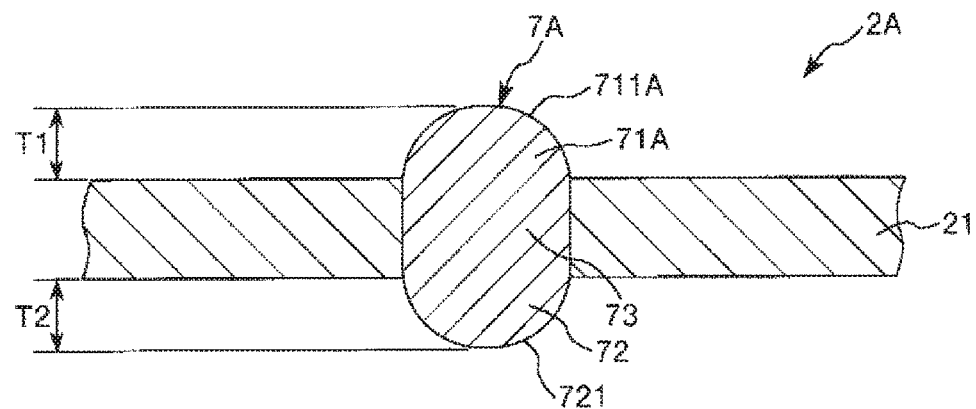
FIG. 5 is a cross-sectional view showing a regulating member included in an electronic component package according to a second embodiment of the invention.

FIG. 5 is a cross-sectional view showing a regulating member included in an electronic component package according to the second embodiment of the invention.

The electronic component package according to the embodiment is similar to the embodiment described above except that the configuration of the regulating member is different.

In the following description, the second embodiment will be described mainly on differences from the embodiment described above, and the description of similar matters is omitted. In FIG. 5, configurations similar to those of the embodiment described above are denoted by the same reference signs and numerals.

In the regulating member 7A included in the package 2A shown in FIG. 5, the configurations of a first projecting portion 71A and the second projecting portion 72 are substantially equivalent to each other.

Specifically, an entire outer surface 711A of the first projecting portion 71A has a spherical shape, and the projecting height T1 of the first projecting portion 71A and the projecting height T2 of the second projecting portion 72 are substantially equivalent to each other.

In the embodiment, since the outer surface 711A of the first projecting portion 71A has a spherical shape similarly to the outer surface 721 of the second projecting portion 72, the contact area of the first projecting portion 71A with the first substrate 3 can be further reduced. Therefore, the heat transfer between the first substrate 3 and the base member 21 through the first projecting portion 71A can be further reduced.

In the embodiment, the entire outer surface 711A of the first projecting portion 71A is of a spherical shape; however, advantageous effects equivalent to the advantageous effects described above can be provided as long as a portion of the outer surface 711A contacting the first substrate 3 has at least a spherical shape even when the entire outer surface 711A is not of a spherical shape.

In the formation of the first projecting portion 71A in which the entire outer surface 711A has a spherical shape, a jig (not shown) that is recessed in a spherical shape may be used instead of the jig 81 (the jig 81 including the recess in which the bottom surface is a flat surface) used in the first embodiment.

Also according to the package 2A, the contact of the first substrate 3 with the base member 21 can be reduced.

Third Embodiment

Next, a third embodiment of the invention will be described.

Figure 6:
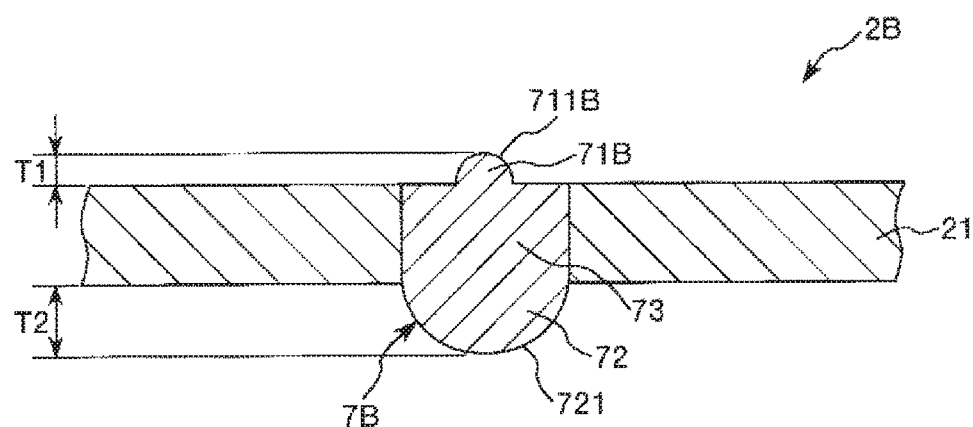
FIG. 6 is a cross-sectional view showing a regulating member included in an electronic component package according to a third embodiment of the invention.

FIG. 6 is a cross-sectional view showing a regulating member included in an electronic component package according to the third embodiment of the invention.

The electronic component package according to the embodiment is similar to the embodiments described above except that the configuration of the regulating member is different.

In the following description, the third embodiment will be described mainly on differences from the embodiments described above, and the description of similar matters is omitted. In FIG. 6, configurations similar to those of the embodiments described above are denoted by the same reference signs and numerals.

In the regulating member 7B included in the package 2B shown in FIG. 6, the area of a first projecting portion 71B is smaller than the area of the second projecting portion 72 in the plan view of the base member 21. Moreover, compared with the projecting height T1 of the first projecting portion 71 in the first embodiment, the projecting height T1 of the first projecting portion 71B in the embodiment is further lowered.

The first projecting portion 71B is located at the central portion of the connection member 73 in a plan view.

By further reducing the area of the first projecting portion 71B in the plan view as described above, the curvature radius can be further reduced, and thus, the contact area of the first projecting portion 71B with the first substrate 3 can be relatively reduced. Therefore, the heat transfer between the first substrate 3 and the base member 21 through the first projecting portion 71B can be further reduced.

Moreover, by further lowering the projecting height T1 of the first projecting portion 71B, the lower profile of the package 2B can be achieved.

Also according to the package 2B, the contact of the first substrate 3 with the base member 21 can be reduced.

Fourth Embodiment

Next, a fourth embodiment of the invention will be described.

Figure 7:
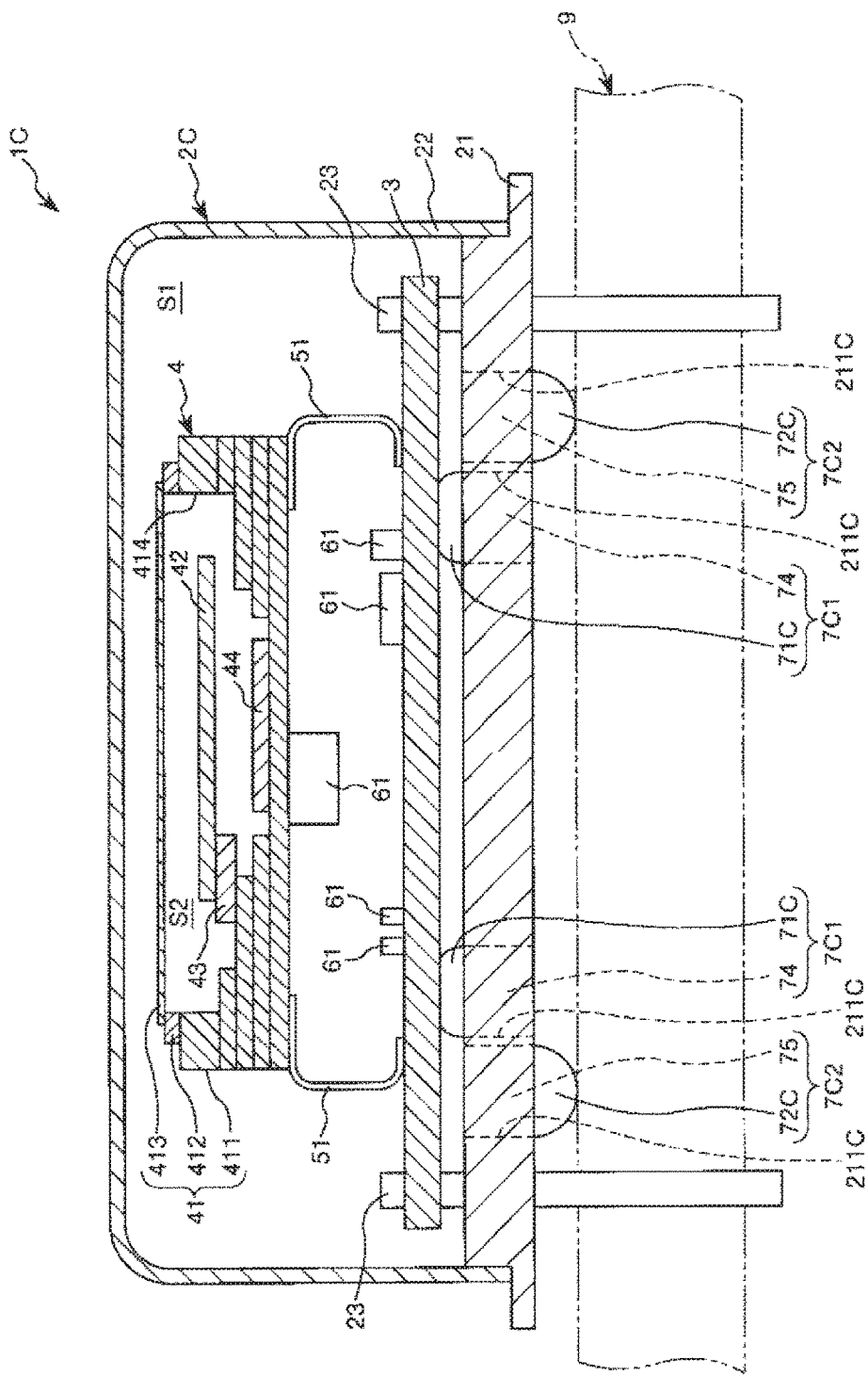
FIG. 7 is a cross-sectional view showing an oscillator including an electronic component package according to a fourth embodiment of the invention.
Figure 8:
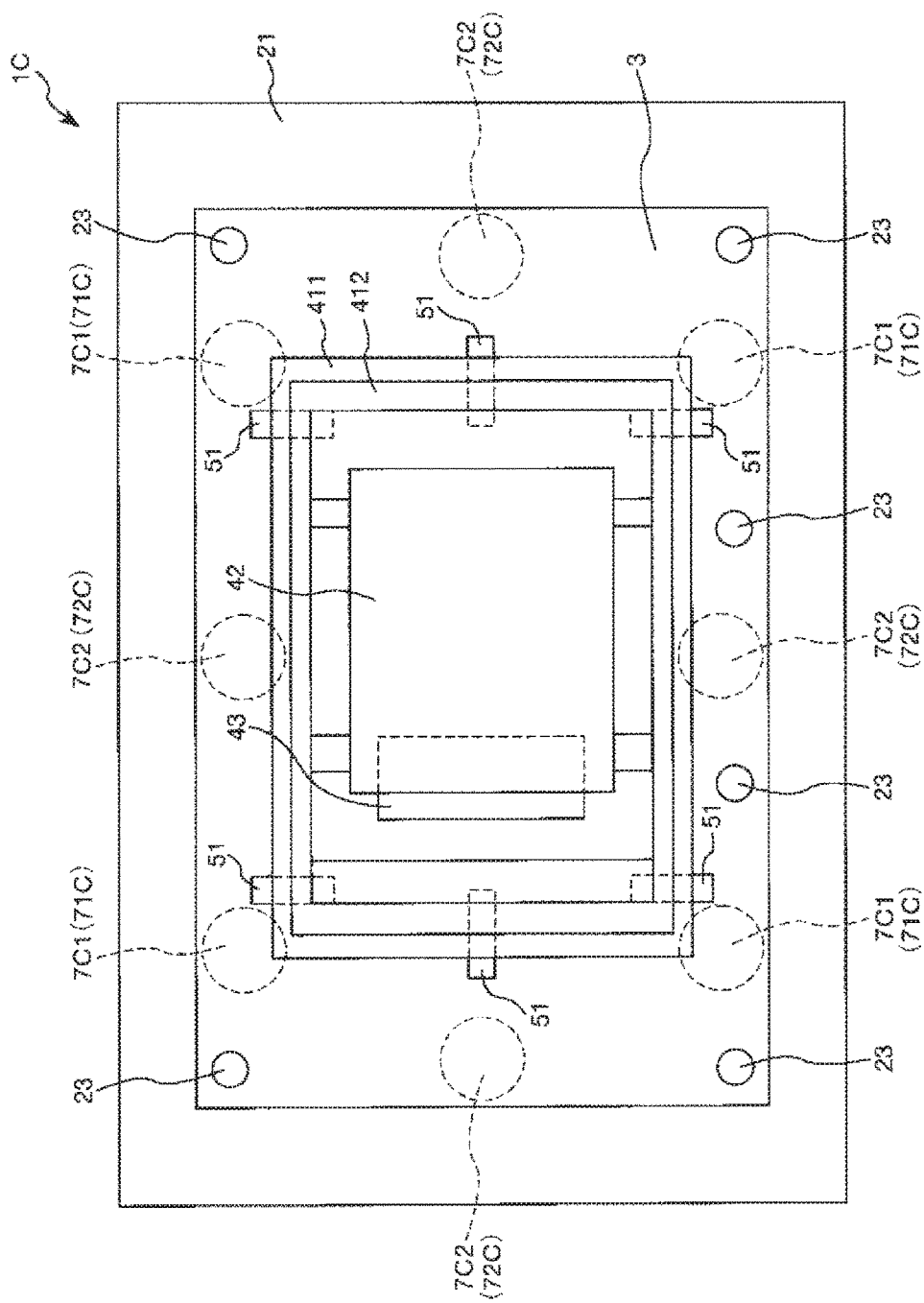
FIG. 8 is a cross-sectional view showing a modified example of the electronic component package according to the fourth embodiment of the invention.

FIG. 7 is a cross-sectional view showing an oscillator including an electronic component package according to the fourth embodiment of the invention. FIG. 8 is a cross-sectional view showing a modified example of the electronic component package according to the fourth embodiment of the invention.

The electronic component package according to the embodiment is similar to the embodiments described above except that the configuration of a regulating member is different.

In the following description, the fourth embodiment will be described mainly on differences from the embodiments described above, and the description of similar matters is omitted. In FIGS. 7 and 8, configurations similar to those of the embodiments described above are denoted by the same reference signs and numerals.

The package 2C included in the oscillator 1C shown in FIG. 7 includes a plurality of (four in the embodiment) first regulating members 7C1 and a plurality of (four in the embodiment) second regulating members 7C2.

The plurality of first regulating members 7C1 and the plurality of second regulating members 7C2 are provided in the peripheral edge portion of the base member 21 (specifically the corner portions of the base member 21).

The first regulating member 7C1 includes a first projecting portion 71C and a filling member 74 filled in a through-hole 211C formed to penetrate the base member 21 in the thickness direction thereof. The first projecting portion 71C and the filling member 74 are integrally configured.

The second regulating member 7C2 includes a second projecting portion 72C and a filling member 75 filled in a through-hole 211C formed to penetrate the base member 21 in the thickness direction thereof. The second projecting portion 72C and the filling member 75 are integrally configured.

In the package 2C as described above, the first projecting portion 71C and the second projecting portion 72C are provided at different positions in the plan view of the base member 21. For this reason, a heat transfer path between the first projecting portion 71C and the second projecting portion 72C can be lengthened. Therefore, the transfer of heat between the inside and the outside of the package 2C through the first projecting portion 71C and the second projecting portion 72C can be reduced.

The arrangement of the first projecting portions 71C and the second projecting portions 72C is not limited to the arrangement shown in FIG. 7, and for example, the first projecting portions 71C and the second projecting portions 72C may be arranged as shown in FIG. 8. That is, the first projecting portion 71C may be provided at the corner portion of the base member 21, and the second projecting portion 72C may be provided between two adjacent corner portions of the base member 21 (a midpoint of a portion along a side of the peripheral portion).

Also according to the package 2C, the contact of the first substrate 3 with the base member 21 can be reduced.

Fifth Embodiment

Next, a fifth embodiment of the invention will be described.

Figure 9:
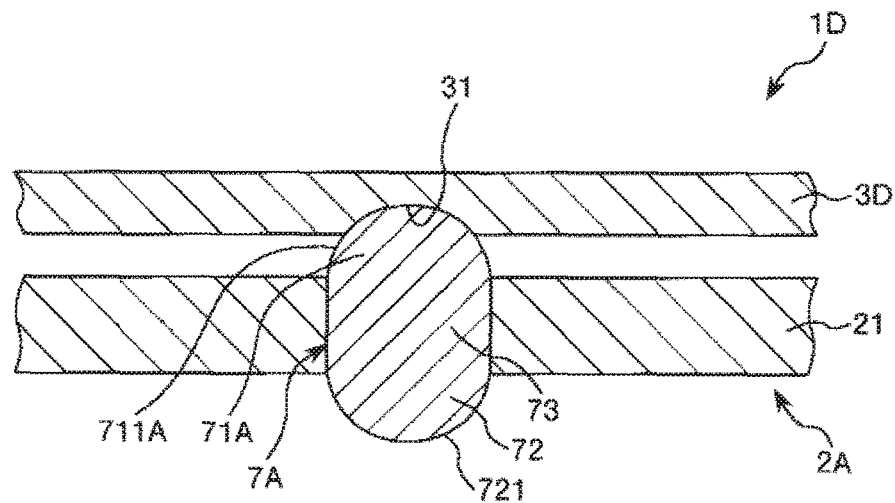
FIG. 9 is a cross-sectional view showing a portion of a first substrate included in an oscillator according to a fifth embodiment of the invention.
Figure 10:
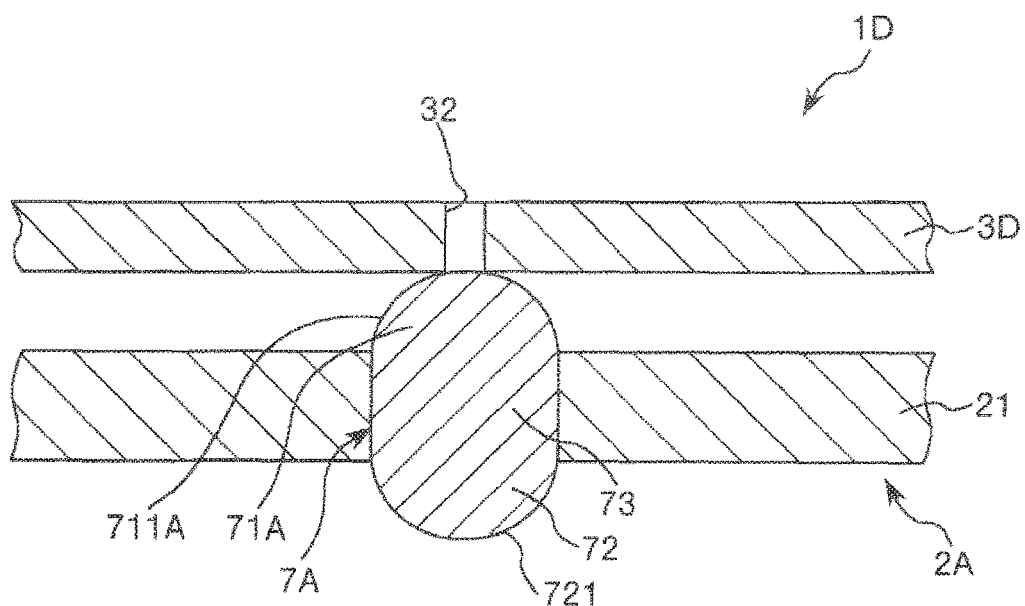
FIG. 10 is a cross-sectional view showing a modified example of the first substrate included in the oscillator according to the fifth embodiment of the invention.

FIG. 9 is a cross-sectional view showing a portion of a first substrate included in an oscillator according to the fifth embodiment of the invention. FIG. 10 is a cross-sectional view showing a modified example of the first substrate included in the oscillator according to the fifth embodiment of the invention.

The oscillator according to the embodiment is similar to that of the embodiments described above except that the configuration of the first substrate is different.

In the following description, the fifth embodiment will be described mainly on differences from the embodiments described above, and the description of similar matters is omitted. In FIG. 9, configurations similar to those of the embodiments described above are denoted by the same reference signs and numerals.

In the first substrate 3D included in the oscillator 1D shown in FIG. 9, a recess 31 is formed in a portion that the regulating member 7A contacts. The recess 31 has a shape corresponding to the upper end portion of the first projecting portion 71A. For this reason, when the first substrate 3D is mounted on the base member 21 included in the package 2A, the upper end portion of the first projecting portion 71A is disposed in the recess 31. With this configuration, a distance between the first substrate 3D and the base member 21 can be further reduced, and thus, the low profile of the package 2A can be further achieved.

In the above, an example in which the recess 31 is formed in the first substrate 3D has been described; however, for example, instead of the recess 31, a through-hole that is opened in both the upper and lower surfaces of the first substrate 3D may be formed in the first substrate 3D. Moreover, in the above, the recess 31 is of a shape corresponding to the upper end portion of the first projecting portion 71A; however, the shape of the recess 31 is not limited to this.

For example, as shown in FIG. 10, a through-hole 32 having a smaller area than the first projecting portion 71A in a plan view may be formed in the first substrate 3D. In this case, a portion around the through-hole 32 contacts the first projecting portion 71A. With this configuration, a contact area between the first substrate 3D and the first projecting portion 71A can be reduced. Therefore, the transfer of heat from the first substrate 3D to the base member 21 can be further reduced. Moreover, compared with the formation of the recess 31, the formation of the through-hole 32 is easier.

2. Electronic Apparatus

Next, an electronic apparatus including the oscillator according to the invention will be described.

Figure 11:
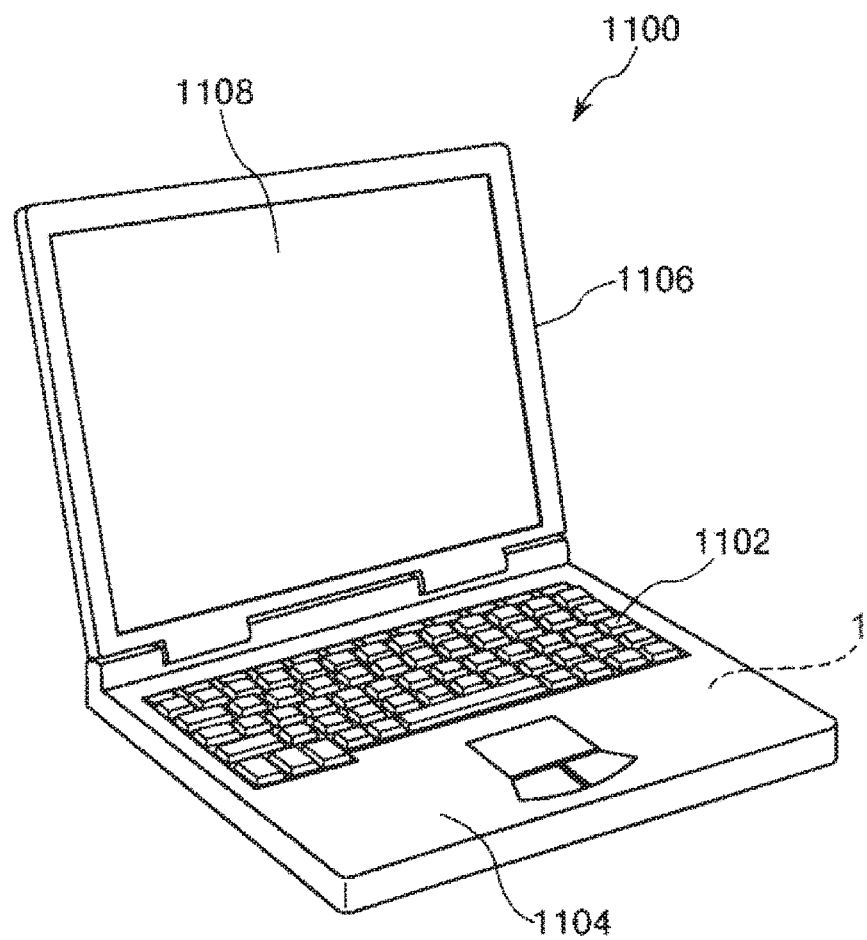
FIG. 11 is a perspective view showing the configuration of a mobile (or notebook) personal computer to which an electronic apparatus according to the invention is applied.

FIG. 11 is a perspective view showing the configuration of a mobile (or notebook) personal computer to which the electronic apparatus according to the invention is applied.

In this drawing, the personal computer 1100 is composed of a main body portion 1104 including a keyboard 1102, and a display unit 1106 including a display 1108. The display unit 1106 is rotatably supported to the main body 1104 through a hinge structure. The oscillator 1 including the package 2 (electronic component package) is incorporated into the personal computer 1100.

Figure 12:
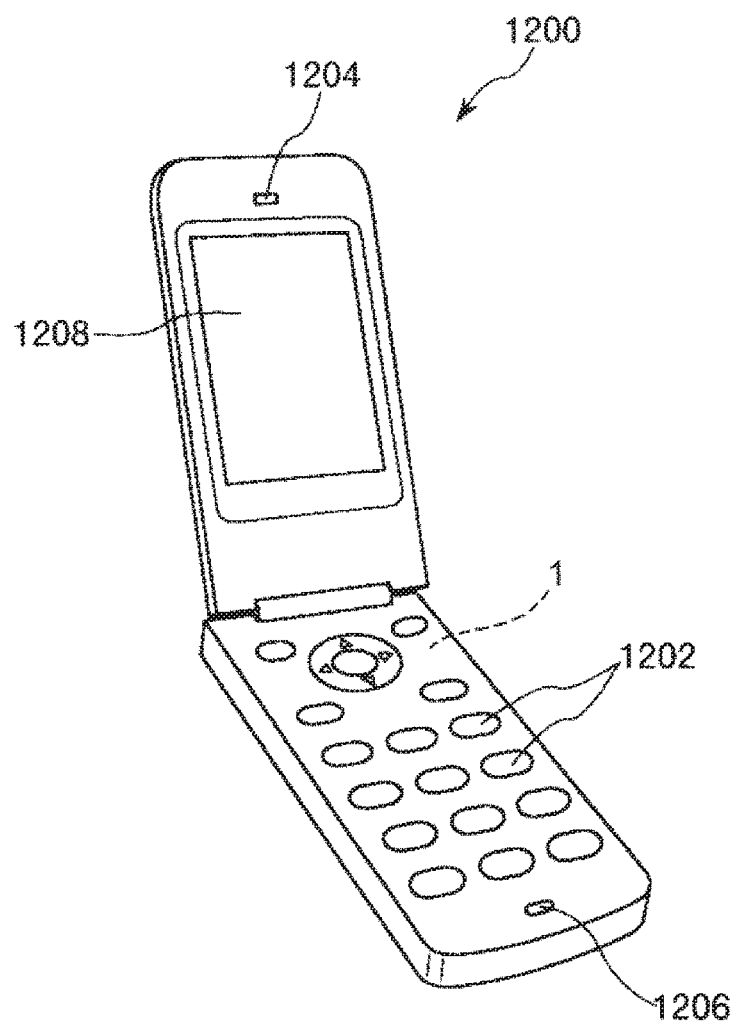
FIG. 12 is a perspective view showing the configuration of a mobile phone (including a PHS) to which the electronic apparatus according to the invention is applied.

FIG. 12 is a perspective view showing the configuration of a mobile phone (including a PHS) to which the electronic apparatus according to the invention is applied.

In this drawing, the mobile phone 1200 includes an antenna (not shown), a plurality of operation buttons 1202, an earpiece 1204, and a mouthpiece 1206. A display 1208 is disposed between the operating buttons 1202 and the earpiece 1204. The oscillator 1 including the package 2 (electronic component package) is incorporated into the mobile phone 1200.

Figure 13:
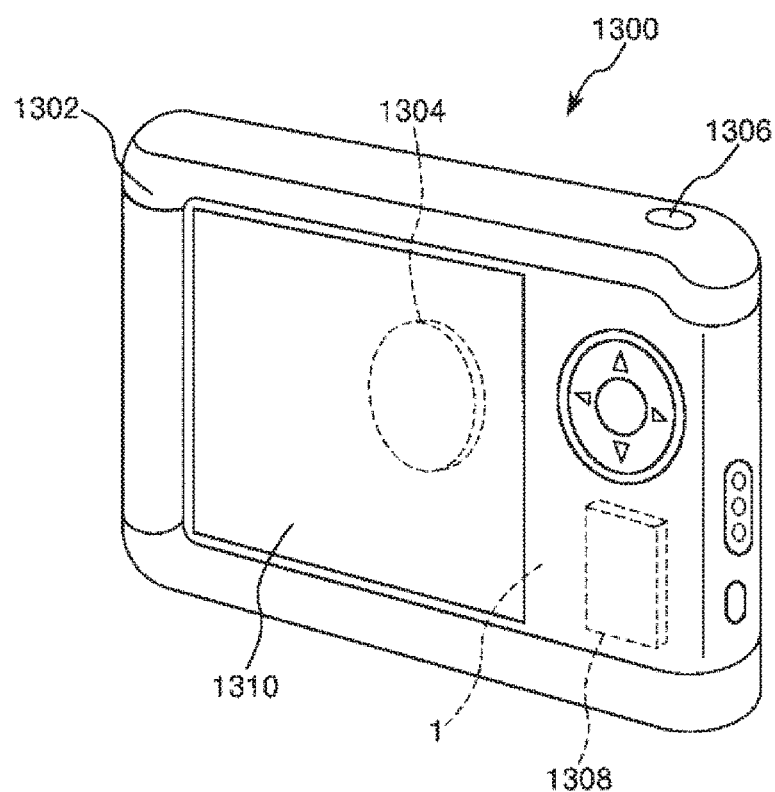
FIG. 13 is a perspective view showing the configuration of a digital still camera to which the electronic apparatus according to the invention is applied.

FIG. 13 is a perspective view showing the configuration of a digital still camera to which the electronic apparatus according to the invention is applied.

A display 1310 is provided on the back of a case (body) 1302 in the digital still camera 1300, and configured to perform display based on imaging signals generated by a CCD. The display 1310 functions as a finder that displays a subject as an electronic image. Moreover, on the front side (the rear side in the drawing) of the case 1302, a light receiver 1304 including an optical lens (imaging optical system) and the CCD is provided. When a photographer confirms the subject image displayed on the display 1310 and presses down a shutter button 1306, imaging signals of the CCD at the time are transferred to and stored in a memory 1308. The oscillator 1 including the package 2 (electronic component package) is incorporated into the digital still camera 1300.

The electronic apparatus includes the oscillator 1 including the package 2 (electronic component package), and therefore has excellent reliability.

In addition to the personal computer in FIG. 11, the mobile phone in FIG. 12, and the digital still camera in FIG. 13, the electronic apparatus according to the invention can be applied to, for example, a smartphone, a tablet terminal, a watch (including a smartwatch), an inkjet ejection device (e.g., an inkjet printer), a laptop personal computer, a television set, a wearable terminal such as a head-mounted display (HMD), a video camcorder, a videotape recorder, a car navigation system, a pager, an electronic notebook (including one with communication function), an electronic dictionary, a calculator, an electronic gaming machine, a word processor, a workstation, a videophone, a surveillance television monitor, electronic binoculars, a POS terminal, a medical device (e.g., an electronic thermometer, a sphygmomanometer, a blood glucose meter, an electrocardiogram measuring system, an ultrasonic diagnosis apparatus, and an electronic endoscope), a fishfinder, various types of measuring instrument, an apparatus for a mobile terminal base station, indicators (e.g., indicators used in a vehicle, aircraft, and a ship), a flight simulator, and a network server.

3. Vehicle

Next, a vehicle including the oscillator according to the invention will be described.

Figure 14:
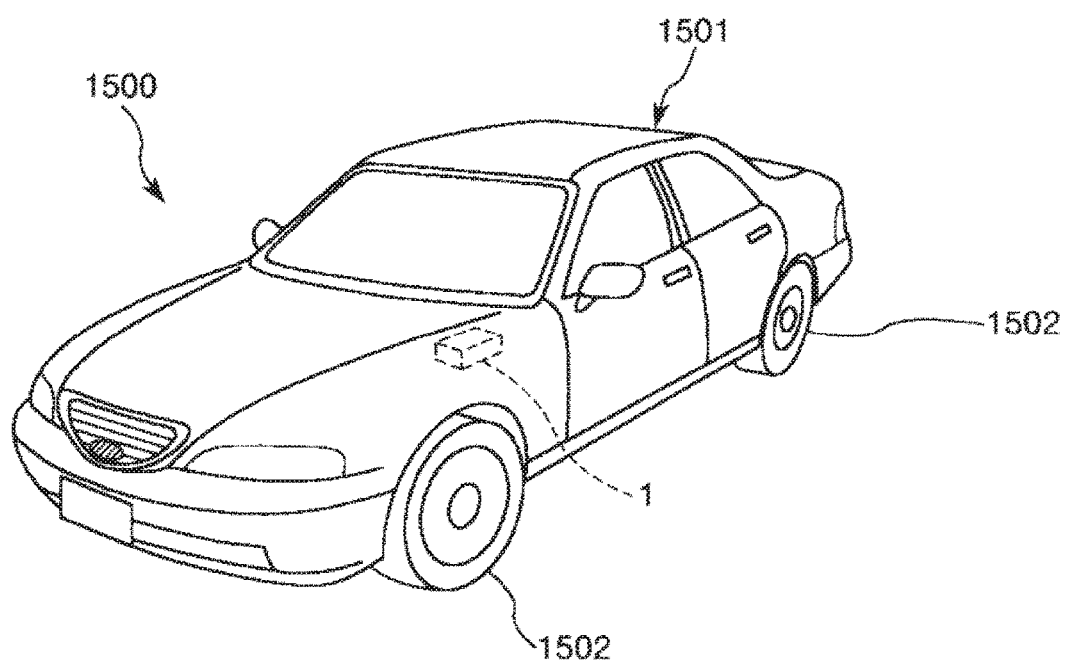
FIG. 14 is a perspective view showing an automobile to which a vehicle including the oscillator according to the invention is applied.

FIG. 14 is a perspective view showing an automobile to which the vehicle including the oscillator according to the invention is applied.

The automobile 1500 shown in FIG. 14 includes a vehicle body 1501 and four wheels 1502, and is configured so as to rotate the wheels 1502 with a not-shown power source (engine) provided in the vehicle body 1501. The oscillator 1 including the package 2 (electronic component package) is incorporated into the automobile 1500.

The oscillator 1 can be widely applied to an electronic control unit (ECU) such as, for example, a keyless entry system, an immobilizer, a car navigation system, a car air-conditioner, an anti-lock brake system (ABS), an air bag, a tire pressure monitoring system (TPMS), engine control, a battery monitor of a hybrid vehicle or an electrical vehicle, and a vehicle body posture control system. By incorporating the oscillator 1 including the package 2 (electronic component package) into the automobile 1500, the automobile 1500 with high reliability is obtained.

4. Base Station

Next, a base station including the oscillator according to the invention will be described.

Figure 15:
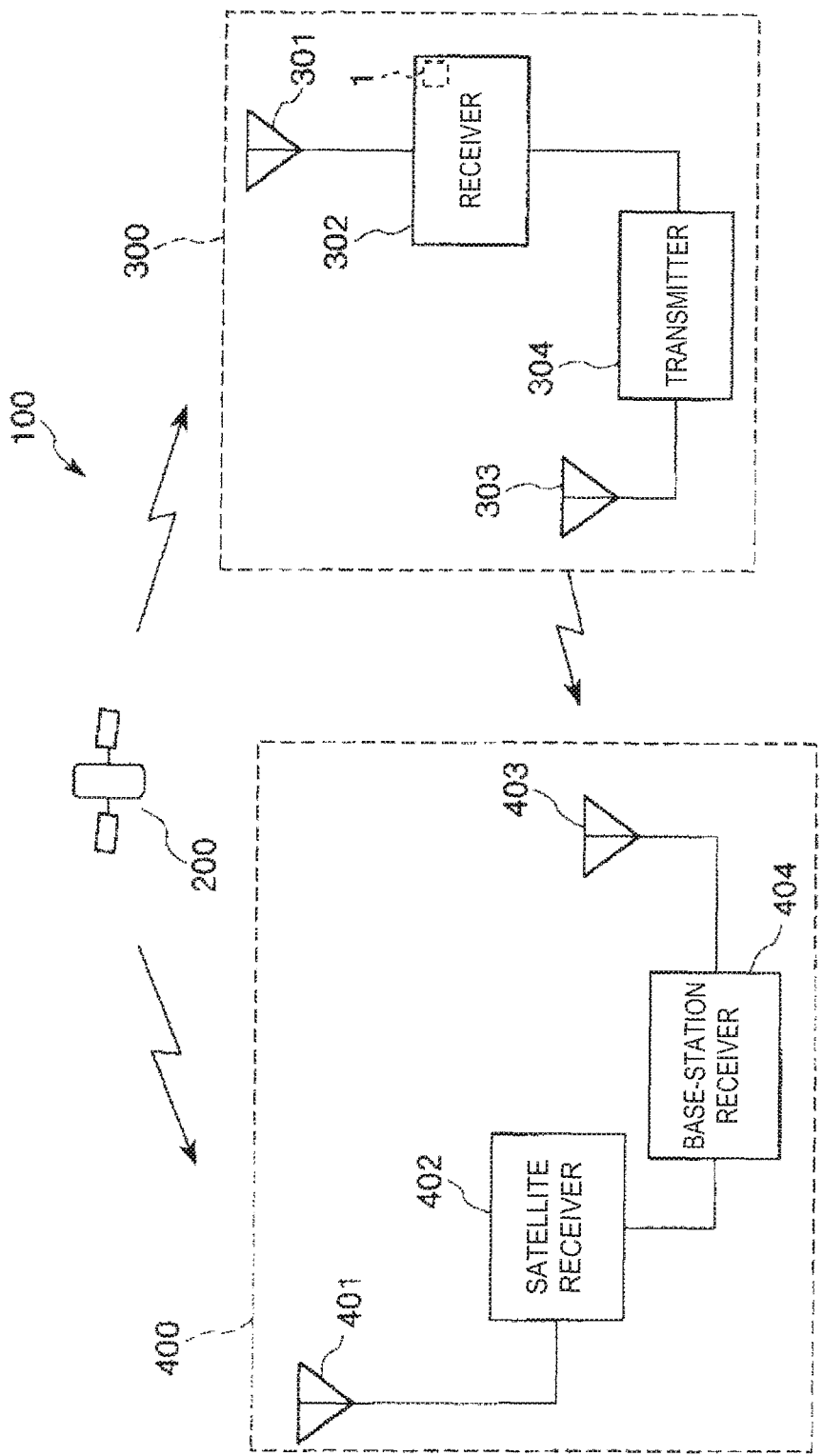
FIG. 15 is a schematic block diagram showing a positioning system to which a base station according to the invention is applied.

FIG. 15 is a schematic block diagram showing a positioning system to which the base station according to the invention is applied.

The positioning system 100 shown in FIG. 15 includes a GPS satellite 200, a base station 300, and a GPS receiver 400.

The GPS satellite 200 transmits positioning information (GPS signal).

The base station 300 includes a receiver 302 that receives positioning information with high accuracy from the GPS satellite 200 through an antenna 301 provided at, for example, an electronic reference point (GPS continuous observation station), and a transmitter 304 that transmits the positioning information received by the receiver 302 through an antenna 303.

Here, the receiver 302 included in the base station 300 is an electronic device including, as a reference frequency oscillation source, the oscillator 1 including the package 2 (electronic component package) described above. The receiver 302 has excellent reliability. Moreover, the positioning information received by the receiver 302 is transmitted in real time by the transmitter 304.

The GPS receiver 400 includes a satellite receiver 402 that receives the positioning information from the GPS satellite 200 through an antenna 401, and a base-station receiver 404 that receives the positioning information from the base station 300 through an antenna 403.

The electronic component package, the oscillator, the electronic apparatus, and the base station according to the invention have been described above based on the embodiments shown in the drawings. However, the invention is not limited to them. The configuration of each part can be replaced with any configuration having a similar function.

Moreover, any other components may be added to the invention. Moreover, the invention may be a combination of any two or more of the configurations (features) of the embodiments.

What is claimed is:

1. An electronic component package comprising:
   a base member;
   a first projecting portion projecting from one surface of the base member, being configured to contact a first substrate on which an electronic component is mounted, and having an insulating property; and
   a second projecting portion projecting from another surface of the base member, being configured to contact a second substrate above which the base member is mounted, and having an insulating property,
   wherein the first projecting portion and the second projecting portion are configured integrally with a member penetrating a through-hole provided in the base member.

2. The electronic component package according to claim 1, wherein
   the first projecting portion and the second projecting portion overlap each other in a plan view of the base member.

3. The electronic component package according to claim 1, wherein
   when the base member is viewed in a plan view, the area of the first projecting portion is smaller than the area of the second projecting portion.

4. The electronic component package according to claim 1, wherein
   a projecting height of the first projecting portion is lower than a projecting height of the second projecting portion.

5. The electronic component package according to claim 1, wherein
   the first substrate includes a recess or through-hole provided in a portion contacting the first projecting portion.

6. The electronic component package according to claim 1, wherein
   at least one of the first projecting portion and the second projecting portion includes a surface having a spherical shape.

7. The electronic component package according to claim 1, further comprising:
   a pin penetrating the first substrate, electrically connected with the first substrate, and having conductivity, wherein
   the first projecting portion and the pin support the first substrate with respect to the base member.

8. The electronic component package according to claim 1, wherein
   the first projecting portion contains glass.

9. The electronic component package according to claim 1, comprising at least three first projecting portions.

10. An oscillator comprising:
    a base member;
    a first substrate;
    a resonator mounted on the first substrate and including a resonator element;
    a first projecting portion projecting from one surface of the base member, contacting the first substrate, and having an insulating property;
    an oscillation circuit electrically connected to the resonator; and a second projecting portion projecting from another surface of the base member, being configured to contact a second substrate above which the base member is mounted, and having an insulating property, wherein the first projecting portion and the second projecting portion are configured integrally with a member penetrating a through-hole provided in the base member.

11. The oscillator according to claim 10, further comprising:

a temperature control element that controls the temperature of the resonator element.

12. An electronic apparatus comprising the electronic component package according to claim 1.

13. A base station comprising the electronic component package according to claim 1.

* * * * *